United States Patent
Staszewski et al.

(10) Patent No.: US 7,482,883 B2
(45) Date of Patent: Jan. 27, 2009

(54) GAIN NORMALIZATION OF A DIGITALLY CONTROLLED OSCILLATOR IN AN ALL DIGITAL PHASE LOCKED LOOP BASED TRANSMITTER

(75) Inventors: Robert B. Staszewski, Garland, TX (US); John Wallberg, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 56 days.

(21) Appl. No.: 11/550,957

(22) Filed: Oct. 19, 2006

(65) Prior Publication Data

US 2007/0085623 A1   Apr. 19, 2007

Related U.S. Application Data

(60) Provisional application No. 60/728,270, filed on Oct. 19, 2005.

(51) Int. Cl.
*H03L 7/06* (2006.01)
*H04L 27/12* (2006.01)

(52) U.S. Cl. .................. 331/23; 331/182; 332/128; 375/306

(58) Field of Classification Search ............... 375/376, 375/306; 331/23; 332/128
See application file for complete search history.

(56) References Cited

U.S. PATENT DOCUMENTS

| 2003/0133522 | A1 | 7/2003 | Staszewski et al. |
| 2003/0137329 | A1* | 7/2003 | Van Der Valk et al. ...... 327/156 |
| 2004/0146132 | A1 | 7/2004 | Staszewski et al. |
| 2006/0033582 | A1 | 2/2006 | Staszewski et al. |
| 2006/0038710 | A1 | 2/2006 | Staszewski et al. |

OTHER PUBLICATIONS

R. B. Staszewski et al., "All-Digitial PLL and GSM/EDGE Transmitter in 90nm CMOS," IEEE International Solid-State Circuits Conference, Feb. 2005, pp. 316-217, 600.
R. B. Staszewski et al., "A Digitally Controlled Oscillator in a 90 nm Digital CMOS Process for Mobile Phones," IEEE Journal of Solid-State Circuits, vol. 40, No. 11, Nov. 2005, pp. 2203-2211.
R. B. Staszewski et al., "All-Digital PLL and Transmitter for Mobile Phones," IEEE Journal of Solid-State Circuits, vol. 40, No. 12, Dec. 2005, pp. 2469-2482.
C. H. Hung et al., "A Digitally Controlled Oscillator System for SAW-Less Transmitters in Cellular Handsets," IEEE Journal of Solid-State Circuits, vol. 41, No. 5, May 2006, pp. 1160-1170.

(Continued)

*Primary Examiner*—Joseph Chang
(74) *Attorney, Agent, or Firm*—Ronald O. Neerings; Wade James Brady, III; Frederick J. Telecky, Jr.

(57) ABSTRACT

A novel mechanism for gain normalization of a digitally controlled oscillator (DCO) in an all digital phase locked loop (ADPLL)-based transmitter that is operative to split the gain normalization multiplication functionality between a modulating path and a PLL loop. The gain normalization of the modulation loop (referred to as modulation path multiplier) comprises a full bit resolution high precision multiplication function. The gain normalization of the PLL loop, on the other hand, is of significantly lower resolution, hence much lower complexity multiplier logic circuitry is required.

16 Claims, 6 Drawing Sheets

OTHER PUBLICATIONS

K. Muhammad et al., "The First Fully Integrated Quad-Band GSM/GPRS Receiver in a 90-nm Digital CMOS Process," IEEE Journal of Solid-State Circuits, vol. 41, No. 8, Aug. 2006, pp. 1772-1783.

Y. C. Ho et al. "Charge-Domain Signal Processing of Direct RF Sampling Mixer with Discrete-Time Filters in Bluetooth and GSM Receivers," EURASIP Journal of Wireless Communications and Networking, vol. 2006, Article 62905, pp. 1-14.

M. Nakai et al., "Dynamic Voltage and Frequency Management for a Low-Power Embedded Microprocessor," IEEE Journal of Solid-State Circuits, vol. 40, No. 18, Jan. 2006, pp. 28-35.

* cited by examiner

GAIN NORMALIZATION OF A DIGITALLY CONTROLLED OSCILLATOR IN AN ALL DIGITAL PHASE LOCKED LOOP BASED TRANSMITTER

REFERENCE TO PRIORITY APPLICATION

This application claims priority under 35 U.S.C. § 119(e) to U.S. Provisional Application Ser. No. 60/728,270, filed Oct. 19, 2005, entitled "New ADPLL architecture for low-power cellular applications," incorporated herein by reference in its entirety.

FIELD OF THE INVENTION

The present invention relates to the field of communications and more particularly relates to a mechanism for gain normalization of a digitally controlled oscillator (DCO) in an all digital phase locked loop (ADPLL)-based transmitter.

BACKGROUND OF THE INVENTION

Oscillators are a key component in the design of radio frequency (RF) communication systems. Accurate knowledge of the modulation gain of an RF oscillator significantly reduces the complexity and increases the performance of the polar transmitter in which the frequency synthesizer is itself a part of the frequency/phase modulation path. It is particularly beneficial in systems implemented in deep submicron CMOS and based on orthogonal frequency/phase and amplitude (i.e. polar) topology. Estimation of RF oscillator frequency-modulation gain is especially important in low-cost high-volume transceivers. In such systems, the phase locked loop sets the loop bandwidth while the transmitter sets the transfer function of the direct frequency modulation path wherein the acceptable gain estimation error ranges from less than 1% for CDMA to several percents for GSM and Bluetooth, for example.

The value of the frequency gain ($K_{DCO}$) of an RF oscillator, such as a digitally controlled oscillator (DCO), at any point in time is a function of frequency as well as the current state of process, voltage and temperature (PVT). For a two point direct modulation scheme such as used in DRP based radios, the modulation accuracy depends on accurate estimation and calibration of the DCO gain.

The DCO gain normalization functions to decouple the phase and frequency information throughout the system from the process, voltage and temperature variations that normally affect the KDCO. The phase information is normalized to the clock period of the oscillator, whereas the frequency information is normalized to the value of an external reference frequency.

Prior art gain normalization circuits typically employ a high precision multiplier in the PLL loop which is used to multiply the filtered and scaled phase error signal by the frequency gain KDCO of the oscillator. Due to the complexity of the high precision multiplier logic circuit, and the fact that it lies in a critical timing path, however, relatively large latencies are likely to be introduced into the loop in addition to high current consumption. In addition, changes made mid-packet or during the transmit operation to the frequency gain are likely to cause unwanted perturbations to the loop output.

It is desirable, therefore, to have a DCO gain normalization technique that does not require a high precision multiplier on the critical path in its implementation. In addition, it is desirable that the DCO gain normalization technique permit dynamic changes to the frequency gain without causing unwanted perturbations to the system.

SUMMARY OF THE INVENTION

The present invention overcomes the problems associated with the prior art by providing a mechanism for gain normalization of a digitally controlled oscillator (DCO) in an all digital phase locked loop (ADPLL)-based transmitter that is operative to split the gain normalization multiplication functionality between a modulating path and a PLL loop. The gain normalization of the modulation loop (referred to as modulation path multiplier) comprises a full bit resolution high precision multiplication function. The gain normalization of the PLL loop, which lies in a critical timing path, on the other hand, is of significantly lower resolution, hence much lower complexity multiplier logic circuitry is required.

There is thus provided in accordance with the invention, a method of oscillator gain normalization in a phase locked loop (PLL) based transmitter, the method comprising the steps of first applying a first gain multiplier to a modulation path, second applying a second gain multiplier to the PLL and wherein the second gain multiplier comprises a significantly less precise version of the first gain multiplier.

There is also provided in accordance with the invention, an apparatus for performing oscillator gain normalization in a phase locked loop (PLL) based transmitter comprising a modulation path comprising a modulating path multiplier adapted to be configured precisely and a PLL comprising a loop multiplier adapted to be configured significantly less precise than that of the modulating path multiplier.

There is further provided in accordance with the invention, a transmitter comprising a phase locked loop (PLL) based frequency synthesizer for performing frequency modulation; the PLL comprising a digitally controlled oscillator (DCO), means for performing oscillator gain normalization in the PLL, the means comprising a modulation path comprising a modulating path multiplier adapted to be configured precisely, a PLL loop comprising a loop multiplier adapted to be configured significantly less precise than that of the modulating path multiplier and a power amplifier comprising operative to generate an RF output signal proportional to the output of the PLL loop and the modulation path.

Note that some aspects of the invention described herein may be constructed as software objects that are executed in embedded devices as firmware, software objects that are executed as part of a software application on either an embedded or non-embedded computer system such as a central processing unit (CPU), digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document.

| Term | Definition |
| --- | --- |
| ADC | Analog to Digital Converter |
| ADPLL | All Digital Phase Locked Loop |
| ASIC | Application Specific Integrated Circuit |
| CDMA | Code Division Multiple Access |
| CMOS | Complementary Metal Oxide Semiconductor |
| CPU | Central Processing Unit |
| CV | Current/Voltage |
| DBB | Digital Baseband |
| DCO | Digital Controlled Oscillator |
| DCXO | Digitally Controlled Crystal Oscillator |
| DRP | Digital RF Processor or Digital Radio Processor |
| DSP | Digital Signal Processor |
| EDGE | Enhanced Data Rates for GSM Evolution |
| FCW | Frequency Command Word |
| FPGA | Field Programmable Gate Array |
| GSM | Global System for Mobile Communication |
| HB | High Band |
| HDL | Hardware Description Language |
| LB | Low Band |
| LDO | Low Drop Out regulator |
| NMOS | n-channel Metal Oxide Semiconductor |
| PA | Power Amplifier |
| PM | Phase Modulation |
| PM | Power Management |
| PVT | Process, Voltage, Temperature |
| RAM | Random Access Memory |
| RF | Radio Frequency |
| RFBIST | RF Built In Self Test |
| SAW | Surface Acoustic Wave |
| SoC | System on Chip |
| SRAM | Static Random Access Memory |
| TDC | Time to Digital Converter |
| VCO | Voltage Controlled Oscillator |

DESCRIPTION OF THE INVENTION

The present invention is a mechanism for gain normalization of a digitally controlled oscillator (DCO) in an all digital phase locked loop (ADPLL)-based transmitter operative to split the gain normalization multiplication functionality between a modulating path and a PLL loop.

The gain normalization of the modulation loop (referred to as modulation path multiplier) comprises a full bit resolution high precision multiplication function. The gain normalization of the PLL loop, on the other hand, is of significantly lower resolution, hence much lower complexity multiplier logic circuitry is required.

Digital RF Processor Overview

Figure 1:
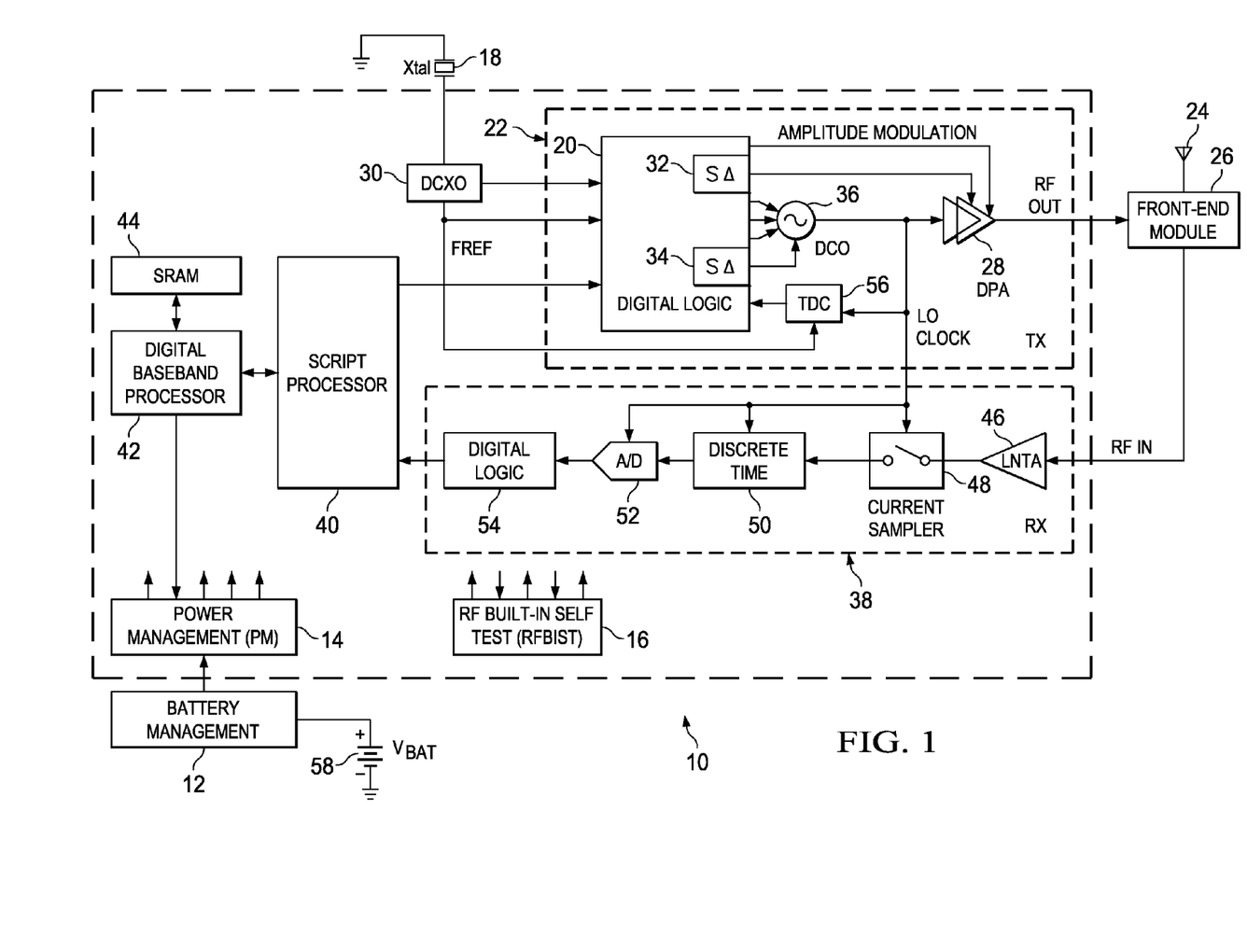
FIG. 1 is a block diagram illustrating a DRP single chip radio incorporating a DCO based transmitter and receiver.

A block diagram illustrating a DRP single chip GSM/EDGE radio incorporating a DCO based transmitter and receiver is shown in FIG. 1. The radio, generally referenced 10, comprises a script processor 40, digital baseband (DBB) processor 42, memory 44 (e.g., static RAM), TX block 22, RX block 38, crystal 18 and digitally controlled crystal oscillator (DCXO) 30, front-end module 26 and antenna 24, power management unit 14, RF built-in self test (BIST) 16, battery 58 and battery management circuit 12. The TX block comprises digital logic block 20 including ΣΔ modulators 32, 34, digitally controlled oscillator (DCO) 36 and digital power amplifier (DPA) 28. The RX block comprises a low noise transconductance amplifier 46, current sampler 48, discrete time processing block 50, analog to digital converter (ADC) 52 and digital logic block 54.

The principles presented herein have been used to develop two generations of a Digital RF Processor (DRP): single-chip Bluetooth and GSM/EDGE radios realized in 130-nm and 90-nm digital CMOS process technologies, respectively. The common architecture is highlighted in FIG. 1 with features added specific to the cellular radio. The all digital phase locked loop (ADPLL) based transmitter employs a polar architecture with all digital phase/frequency and amplitude modulation paths. The receiver employs a discrete-time architecture in which the RF signal is directly sampled and processed using analog and digital signal processing techniques.

A key component is the digitally controlled oscillator (DCO) 36, which avoids any analog tuning controls. A digitally-controlled crystal oscillator (DCXO) generates a high-quality basestation-synchronized frequency reference such that the transmitted carrier frequencies and the received symbol rates are accurate to within 0.1 ppm. Fine frequency resolution is achieved through high-speed ΣΔ dithering of its varactors. Digital logic built around the DCO realizes an all-digital PLL (ADPLL) that is used as a local oscillator for both the transmitter and receiver.

The polar transmitter architecture utilizes the wideband direct frequency modulation capability of the ADPLL and a digitally controlled power amplifier (DPA) 28 for the amplitude modulation. The DPA operates in near-class-E mode and uses an array of nMOS transistor switches to regulate the RF amplitude. It is followed by a matching network and an external front-end module 26, which comprises a power amplifier (PA), a transmit/receive switch for the common antenna 24 and RX surface acoustic wave (SAW) filters. Fine amplitude resolution is achieved through high-speed ΣΔ dithering of the DPA nMOS transistors.

The receiver 38 employs a discrete-time architecture in which the RF signal is directly sampled at the Nyquist rate of the RF carrier and processed using analog and digital signal processing techniques. The transceiver is integrated with a script processor 40, dedicated digital base band processor 42 and SRAM memory 44. The script processor handles various TX and RX calibration, compensation, sequencing and lower-rate data path tasks and encapsulates the transceiver complexity in order to present a much simpler software programming model.

The frequency reference (FREF) is generated on-chip by a 26 MHz digitally controlled crystal oscillator (DCXO) 30. An energy management system, i.e. power management (PM) 14, consists of a bandgap generator and multiple low-dropout (LDO) voltage regulators to supply voltage to various radio subsystems as well as to provide good noise isolation between them.

The RF built-in self-test (RFBIST) 16 executes an autonomous transceiver performance and compliance testing of the GSM standard. The transceiver is integrated with the digital baseband, SRAM memory in a complete system-on-chip (SoC) solution. Almost all the clocks on this SoC are derived from and are synchronous to the RF oscillator clock. This helps to reduce susceptibility to the noise generated through clocking of the massive digital logic.

A more detailed description of the operation of the ADPLL can be found in U.S. Patent Publication No. 2006/0033582A1, published Feb. 16, 2006, to Staszewski et al., entitled "Gain Calibration of a Digital Controlled Oscillator," and U.S. Patent Publication No. 2006/0038710A1, published Feb. 23, 2006, Staszewski et al., entitled "Hybrid Polar/Cartesian Digital Modulator," both of which are incorporated herein by reference in their entirety.

Wideband ADPLL: First Embodiment

Figure 2:
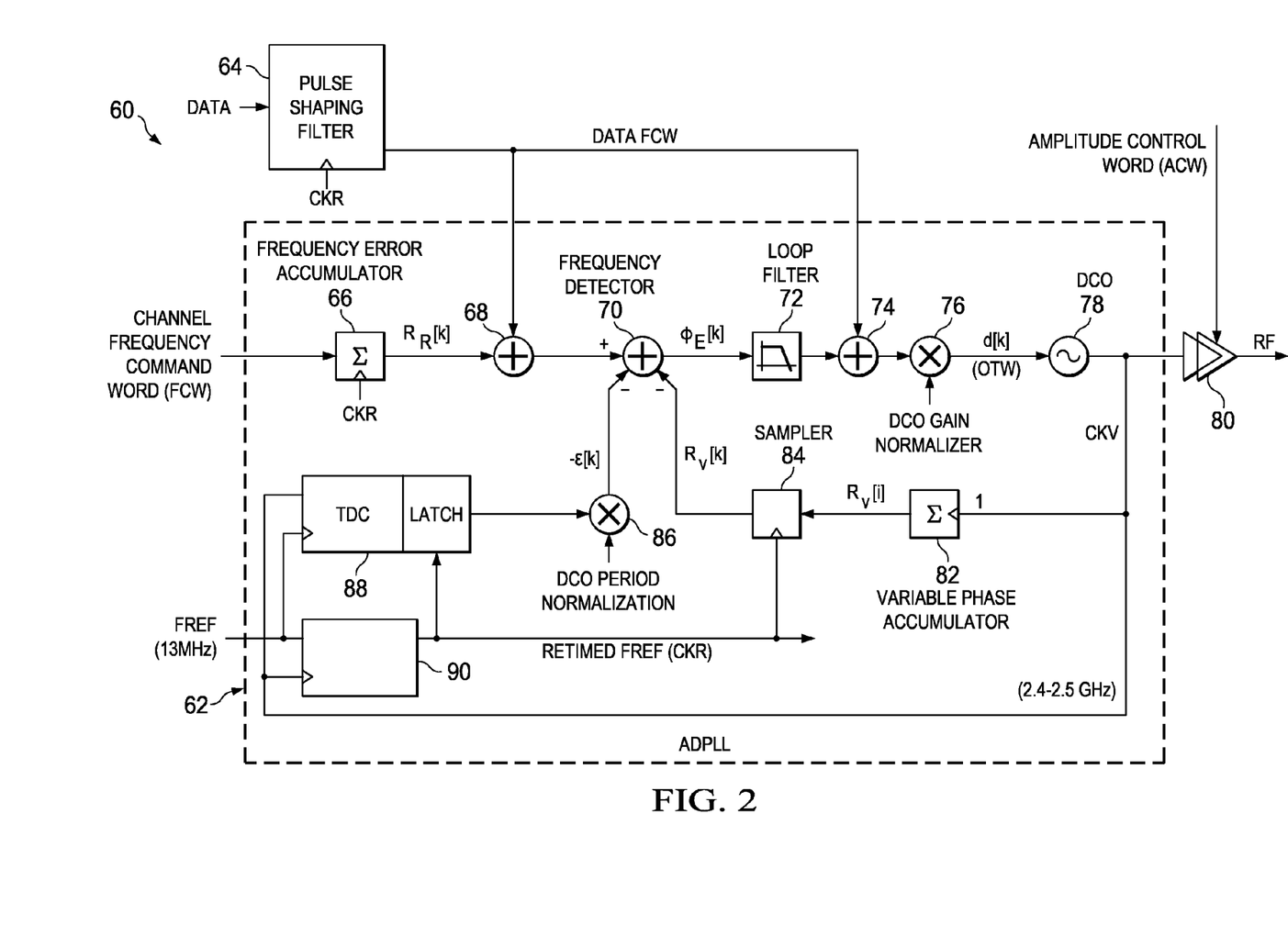
FIG. 2 is a block diagram illustrating a first embodiment transmitter based on an all digital PLL.

A block diagram illustrating a first embodiment transmitter based on an all digital phase domain PLL incorporating time to digital converter (TDC) and digitally controlled oscillator (DCO) circuits with wideband frequency modulation capability is shown in FIG. 2. The transmitter, generally referenced 60, comprises pulse shaping filter 64, digital pre-power amplifier 80 and ADPLL 62. The ADPLL comprises a reference phase accumulator 66, adders 68, 74, time to digital converter (TDC) system 88, phase detector 70, loop filter 72, DCO gain normalizer 76, frequency reference retimer 90, sampler 84, DCO period normalization 86 and digitally controlled oscillator (DCO) 78.

Further details of the operation of the transmitter 60 can be found in U.S. Patent Publication No. 2006/0033582A1 and U.S. Patent Publication No. 2006/0038710A1 cited supra. The frequency reference (FREF) clock contains the only reference timing information for the RF frequency synthesizer to which phase and frequency of the RF output are to be synchronized.

The RF variable output frequency $f_V$ is related to the reference frequency $f_R$ according to the following formula.

$$f_V = N \cdot f_R \quad (1)$$

where, N≡FCW is real-valued. The FREF source features an excellent long-term accuracy and stability, at least as compared to the variable RF oscillator.

FIG. 2 illustrates the details of the first generation DRP transmitter (first embodiment) based on an ADPLL with a wideband frequency modulation capability, which targets Bluetooth standard for short-range wireless communications. The digitally-controlled oscillator (DCO) produces a digital clock CKV in the RF frequency band. In the feedforward path, the CKV clock toggles an NMOS transistor switch of the near class-E RF power amplifier (PA) that is followed by a matching network, and then terminated with an antenna. In the feedback path, the CKV clock is used to retime the FREF clock. The FREF retiming quantization error is determined by the time-to-digital converter (TDC), which is built as an array of inverter delay elements and registers, in order to compensate the quantization error by the system. The above operation strips FREF of its critical timing information and produces a retimed clock CKR that is subsequently used throughout the system. The CKR edge timestamps are now synchronous to the RF oscillator, in which time separation between the closest CKR and CKV edges is time invariant.

Figure 3:
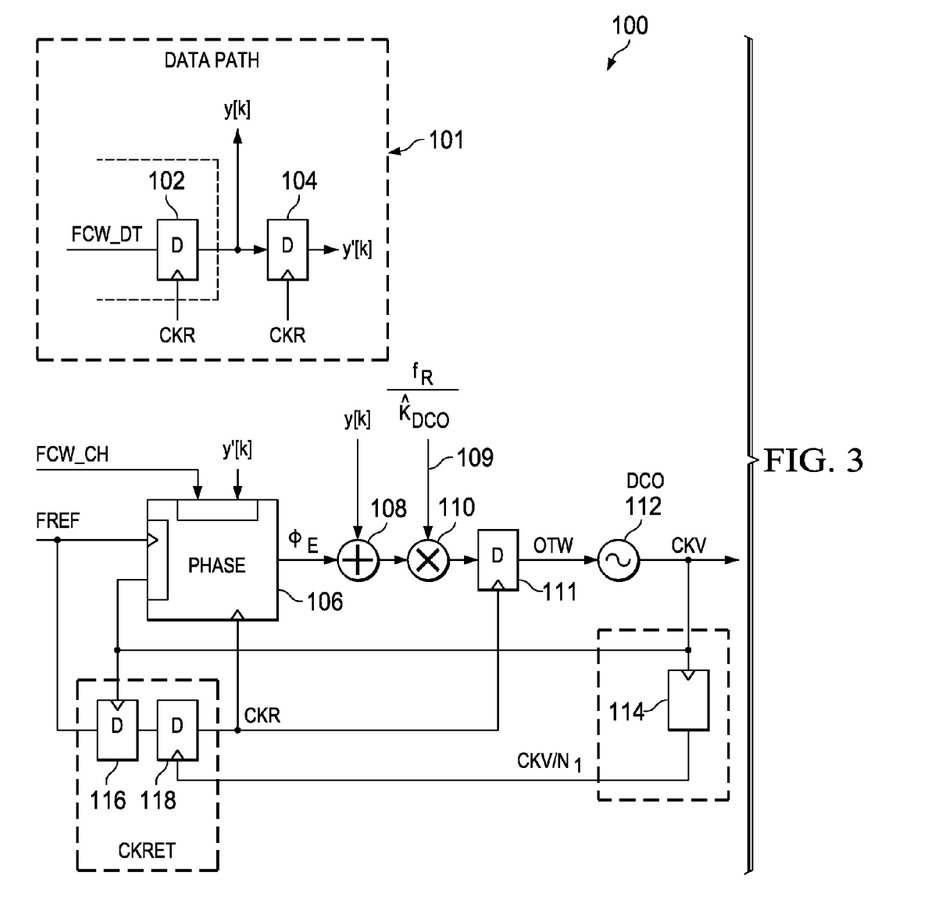
FIG. 3 is a simplified block diagram illustrating the phase modulation path of the first embodiment transmitter of FIG. 2.

A block diagram illustrating the phase modulation path of the first embodiment transmitter of FIG. 2 is shown in FIG. 3. The circuit 100 illustrates the baseband transmit data path 101 (consisting of registers 102, 104 and wherein FCW_DT is the modulation data frequency command word) and the ADPLL loop, comprising phase accumulator/detector 106, adder 108, gain normalization 110, registers 116, 118, 111, clock divider 114 and DCO 112.

This Figure highlights the phase/frequency modulation path in the first embodiment DRP. In order to ease timing in actual interfaces between the FREF, CKR and CKVD domains, the FREF clock retiming circuitry further performs retiming by the CKV/$N_1$ clock, where $N_1$=8 is implemented.

Several key features of the architecture include the following. First, the ADPLL phase operation and the entire PM modulation are performed on the CKR clock. Second, the phase error samples $\phi_E$ and the FCW-normalized modulating data samples y[k] of the feed-forward branch are merged before the tuning word computation. Third, to the extent of the DCO support of high frequency deviations and correct DCO gain estimation, $K_{DCO}$, the modulating path bandwidth is flat from DC to $f_R/2$. Fourth, the DCO gain multiplier, $f_R/K_{DCO}$, controls both the modulation index m=$2 \cdot f_{pk} \cdot T_s$ and the PLL bandwidth. For GSM, m=0.5 and $K_{DCO}$ must be estimated precisely.

Implementation of the DCO gain normalization 110 in this first embodiment requires the use of a precision multiplier to multiply $f_R/K_{DCO}$ by the phase error, and the multiplier lies on the critical timing path. This has the disadvantage of requiring a large number of gates to implement the complex circuitry of the multiplier. To meet the loop timing requirements, pipelining must be used which adds additional latency to the loop and extra registers. In addition, changes to the gain coefficient as a result of updated KDCO estimates calculated during transmission generate large perturbations to the loop. This is due to the new gain multiplier value changing the DC offsets to the phase error value. This results in undesirable jumps in the output of the DCO.

Wideband ADPLL: Second Embodiment

Figure 4:
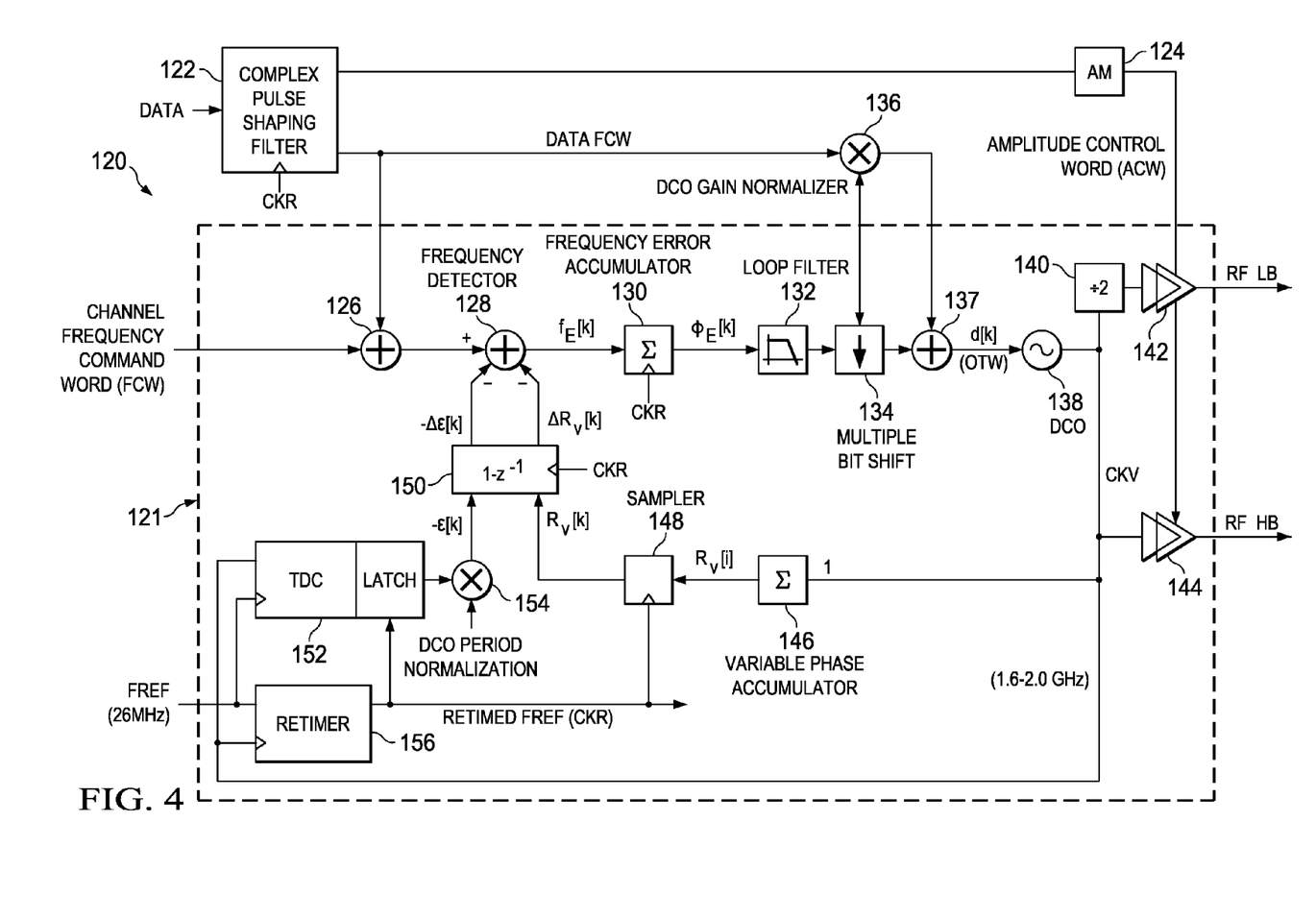
FIG. 4 is a block diagram illustrating a second embodiment DRP transmitter based on an all digital PLL and incorporating the gain normalization mechanism of the present invention.

In accordance with the invention, a DCO gain normalization mechanism that overcomes these disadvantages is provided. A block diagram illustrating a second embodiment DRP transmitter based on an all digital PLL and incorporating the gain normalization mechanism of the present invention is shown in FIG. 4. The transmitter, generally referenced 120, comprises complex pulse shaping filter 122, amplitude modulation block 124, low and high band digital pre-power amplifiers 142, 144, respectively, and ADPLL 121. The transmitter is operative to perform quadrature modulation in the polar domain in addition to the generation of the local oscillator (LO) signal for the receiver. Almost all clocks in the system are derived directly from this source. Note that the transmitter is constructed using digital techniques that exploit the high speed and high density of the advanced CMOS, while avoiding problems related to voltage headroom. The ADPLL circuit 121 replaces a conventional RF synthesizer architecture (based on a voltage-controlled oscillator (VCO) and a phase/frequency detector and charge-pump combination), with a digitally controlled oscillator (DCO) 138 and a time-to-digital converter (TDC) 152. All inputs and outputs are digital and some even at multi-GHz frequency.

The ADPLL 121 comprises adders 126, 137, frequency detector 128, frequency error accumulator 130, loop filter 132, multiple bit shift 134, DCO gain normalizer 136, DCO 138, divider LB 140, variable phase accumulator 146, sampler 148, FREF retimer 156, TDC 152, variable phase differentiator 150 and TDC DCO-period normalizer 154.

Note that the clock input to the AM block may comprise CKR clock or CKV divided clock. The core of the ADPLL is a digitally controlled oscillator (DCO) adapted to generate the RF oscillator clock CKV. The oscillator core (not shown) operates at twice the 1.6-2.0 GHz high band (HB) frequency, which is then divided for precise generation of RX quadrature signals.

The single DCO is shared between transmit and receive and is used for both the high frequency bands (HB) and the low frequency bands (LB). An additional 4-bits of the tracking bank varactors are dedicated for sigma-delta dithering in order to improve frequency resolution.

The DCO tuning capacitance is split into a large number of tiny capacitors that are selected digitally. Advanced lithography processes available today permit creation of extremely fine variable capacitors (i.e. varactors) at approximately 40 attofarads of capacitance per step, which equates to the control of only 250 electrons entering or leaving the resonating LC tank (not shown). Despite the small capacitance step, the resulting frequency step at the 2 GHz RF output is 10-20 kHz, which is too coarse for wireless applications. Thus, the fast switching capability of the transistors is utilized by performing programmable high-speed (225-900 MHz) dithering of the finest varactors. The duty cycle of the high/low capacitive states establishes the time-averaged resonating frequency resolution, now less than 1 kHz. All the varactors are realized as n-poly/n-well MOSCAP devices that operate in the flat regions of their CV curves.

The ADPLL operates in a digitally synchronous fixed-point phase domain but employs frequency detection rather than phase detection. The expected variable frequency $f_V$ is related to the reference frequency $f_R$ by the frequency command word (FCW) as follows.

$$FCW[k] \equiv \frac{E(f_V[k])}{f_R} \quad (2)$$

The FCW is time variant and is allowed to change with every cycle $T_R=1/f_R$ of the frequency reference clock. With $W_F=24$ fractional part word length of FCW, the ADPLL provides fine frequency control with 1.5 Hz accuracy, according to:

$$\Delta f_{res} = \frac{f_R}{2^{W_F}} \quad (3)$$

The number of integer bits $W_I=8$ was chosen to fully cover the GSM band frequency range of $f_V=1600$-2000 MHz with an arbitrary reference frequency $f_R \geqq 8$ MHz.

The ADPLL sequencer traverses through the process, voltage, temperature (PVT) calibration and acquisition modes during channel selection and frequency locking and stays in the tracking mode during the transmission or reception of a burst. To extend the DCO range to accommodate for voltage and temperature drifts, and to allow wide frequency modulation, the coarser-step acquisition bits are engaged by subtracting an equivalent number (generally fractional) of the tracking bank varactors. The varactor frequency step calibration is performed just before each burst with minimal overhead using dedicated hardware.

The variable phase $R_V[i]$ is determined by counting the number of rising clock transitions of the DCO oscillator clock CKV:

$$R_V[i] = \sum_{l=0}^{i} 1 \quad (4)$$

The index i indicates the DCO edge activity. The FREF sampled variable phase $R_V[k]$, where k is the index of the FREF activity edge activity, is fixed point concatenated with the normalized time-to-digital converter (TDC) output $\epsilon[k]$. The TDC measures and quantizes the time differences between the frequency reference (FREF) and the DCO clock edges. The sampled differentiated variable phase is subtracted from the frequency command word (FCW) by the digital frequency detector. The frequency error $f_E[k]$ samples $$f_E[k]=FCW-[(R_V[k]-\epsilon[k])-(R_V[k-1]-\epsilon[k-1])] \quad (5)$$

are accumulated (i.e. integrated back to phase) via frequency error accumulator 40 to create the phase error $\phi_E[k]$ samples $$\phi_E[k] = \sum_{l=0}^{k} f_E[k] \quad (6)$$

Figure 5:
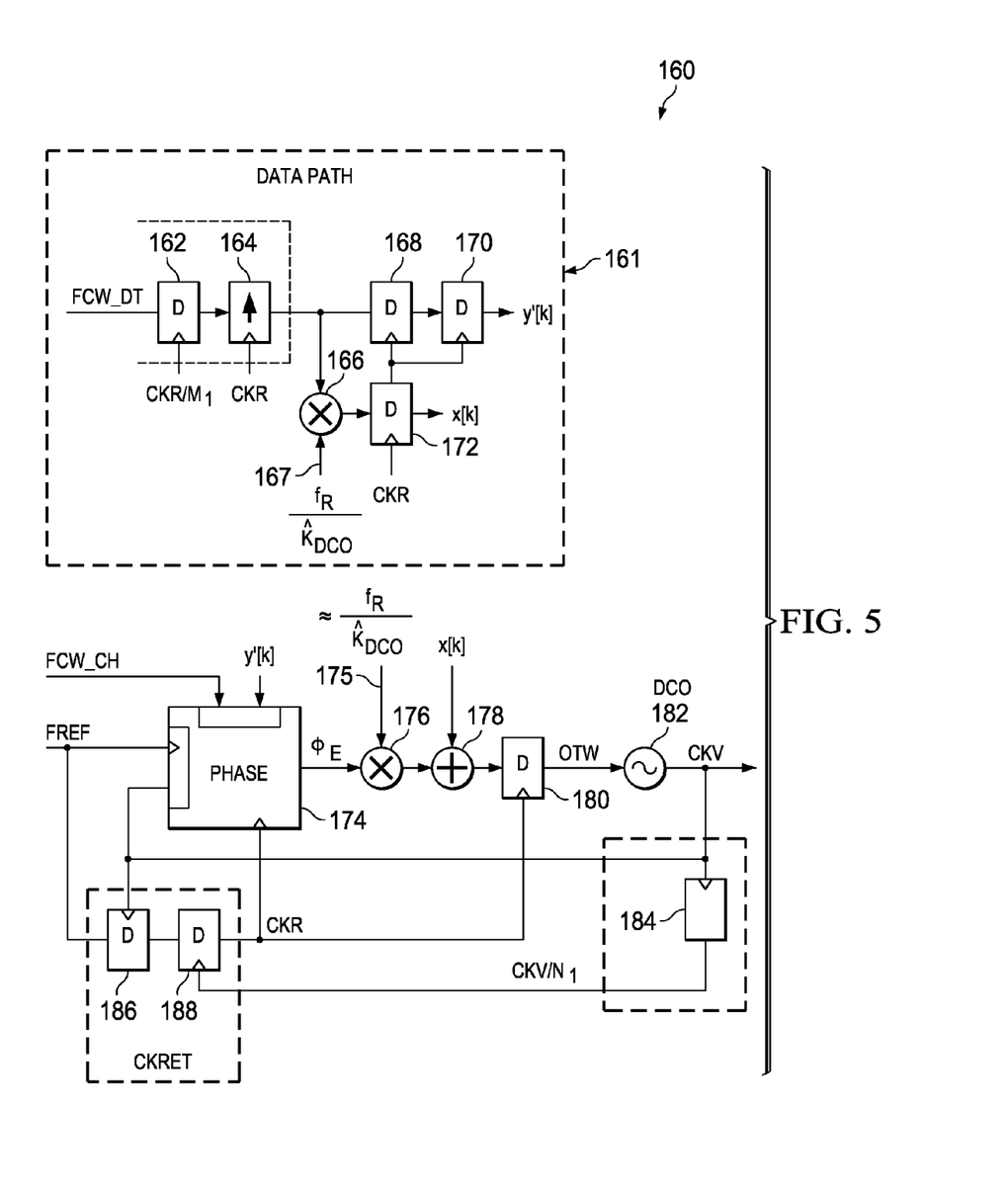
FIG. 5 is a simplified block diagram illustrating the phase modulation path of the second embodiment transmitter of FIG. 4.

A block diagram illustrating the phase modulation path of the second embodiment transmitter of FIG. 4 is shown in FIG. 5. The circuit 160 illustrates the baseband data or modulation path 161 and ADPLL loop. The modulation path comprises source output register 162, delay registers 168, 170, 172, re-sampler or rate change converter 164 and gain normalizer 166 wherein FCW_DT is the modulation data frequency command word. The ADPLL loop comprises phase accumulator/detector system 174, gain normalization 176, adder 178, register 180, retiming registers 186, 188, clock edge divider 184 and DCO 182. This Figure illustrates the phase/frequency modulation path in the second generation DRP (i.e. second embodiment), which targets the GSM standard. In the GSM standard, the output of the pulse shaping filter is proportional to the frequency deviation and no conversion to the phase-proportional signal is explicitly required.

In accordance with the invention, the multiplier 166 comprises a full precision multiplier whereas multiplier 176 is of far lower precision. Modulation path gain normalization is operative to multiply the modulation data by a full precision $f_R/K_{DCO}$ value, in order to control the modulation index and provide low level of modulation distortion. The loop gain normalization 176, however, is not required to be of the same high precision as that of the normalizer 166 in the modulation path. The only requirement on the precision of the $f_R/K_{DCO}$ value is that it must be sufficiently accurate to meet the desired accuracy of the PLL bandwidth.

Several key features of the architecture of the second embodiment as described below. First, the ADPLL phase operation and the PM modulation are performed on the CKR clock. In order to reduce circuit complexity and save dissipated power, the pulse-shaping filter at the front-end of the modulating path can operate at a lower CKR/$M_1$ rate, where $M_1$ is an integer, followed by the CKR-rate upsampler.

Second, the tuning word samples and the DCO-normalized modulating data samples x[k] of the feed-forward branch are merged before the final CKR-clocked flip-flop 180 of the DCO interface. Third, to the extent of the DCO support of high frequency deviations and correct DCO gain estimation, $K_{DCO}$, the modulating path bandwidth is flat from DC to $f_R/2$.

The DCO gain multiplier, $f_R/K_{DCO}$ appears now independently in two places. Only the modulating path multiplier $f_R/K_{DCO}$ which controls the modulation index, is required to be configured precisely. The ADPLL loop multiplier needs only to be accurate to the extent of the desired accuracy of the PLL bandwidth.

With reference to FIG. 5, modulation data FCW_DT is re-sampled via several registers in order to control the delay. The modulation data is then multiplied by a full resolution version of the gain multiplier $f_R/K_{DCO}$ to generate x[k]. This high precision version of the gain multiplier is referred to as the modulation path multiplier. The output y'[k] is input to the phase accumulator/detector which functions to generate the phase error. The phase error is then multiplied by a lower precision version of the gain multiplier $\approx f_R/K_{DCO}$ (referred to as the loop multiplier).

The notation '$\approx$' denotes a lower resolution version of the gain multiplier can be used for multiplication by the phase error. It is noted that this feature is an advantage of the second DRP embodiment over the first DRP embodiment described supra. A major benefit of the architecture of the second embodiment, it that the loop multiplier (i.e. $\approx f_R/K_{DCO}$) of the phase error can have significantly lower complexity. This is advantageous considering the critical nature of the PLL closed loop path where delays are critical to operation and excessive delays cannot be tolerated.

This is in contrast to the modulation path where delays are far less critical.

Full bit multiplication resolution of multiplier 176, as required in the first embodiment, requires pipeline in order meet loop timing requirements, which adds delay latency and extra registers which effect stability. Whereas, the less critical timing nature of the second embodiment permits the modulation path 161 to employ full bit multiplication resolution with any necessary pipelining since it is not a closed loop. As an example, consider a 12 bit full resolution gain multiplier. In accordance with the invention, the full 12-bit gain normalization is performed in the modulation path. In the PLL loop, however, only 3-bits (i.e. providing 12% of bandwidth accuracy) are required to meet the particular loop bandwidth accuracy in this example. Thus, the multiplier can be drastically reduced in size, complexity and cost. As a result, mid-packet KDCO estimates are affected only in the modulation path and not in the PLL loop. This prevents any negative effect on loop dynamics.

In addition, updates of KDCO estimation performed in the middle of the packet do not affect the loop multiplier 176 since they would not be needed due to its much lower precision. Updated KDCO estimates are only affected in the full resolution gain normalization 166 of the modulation path and not in the PLL loop. Changing the gain normalization in the modulation path and not in the PLL loop does not cause any jumps or perturbations to the loop dynamics.

Since the data has zero mean value, updating the gain multiplier does not affect the modulation output. Since the phase error in the PLL loop has a non-zero mean, a change in the gain multiplier would cause undesirable loop perturbation.

Thus, splitting the function of the single gain multiplier in the first embodiment into two gain multipliers, one of high precision and one of lower precision makes the two paths impendent of each other in terms of dynamic updates of the KDCO estimates.

Wideband ADPLL: Third Embodiment

Figure 6:
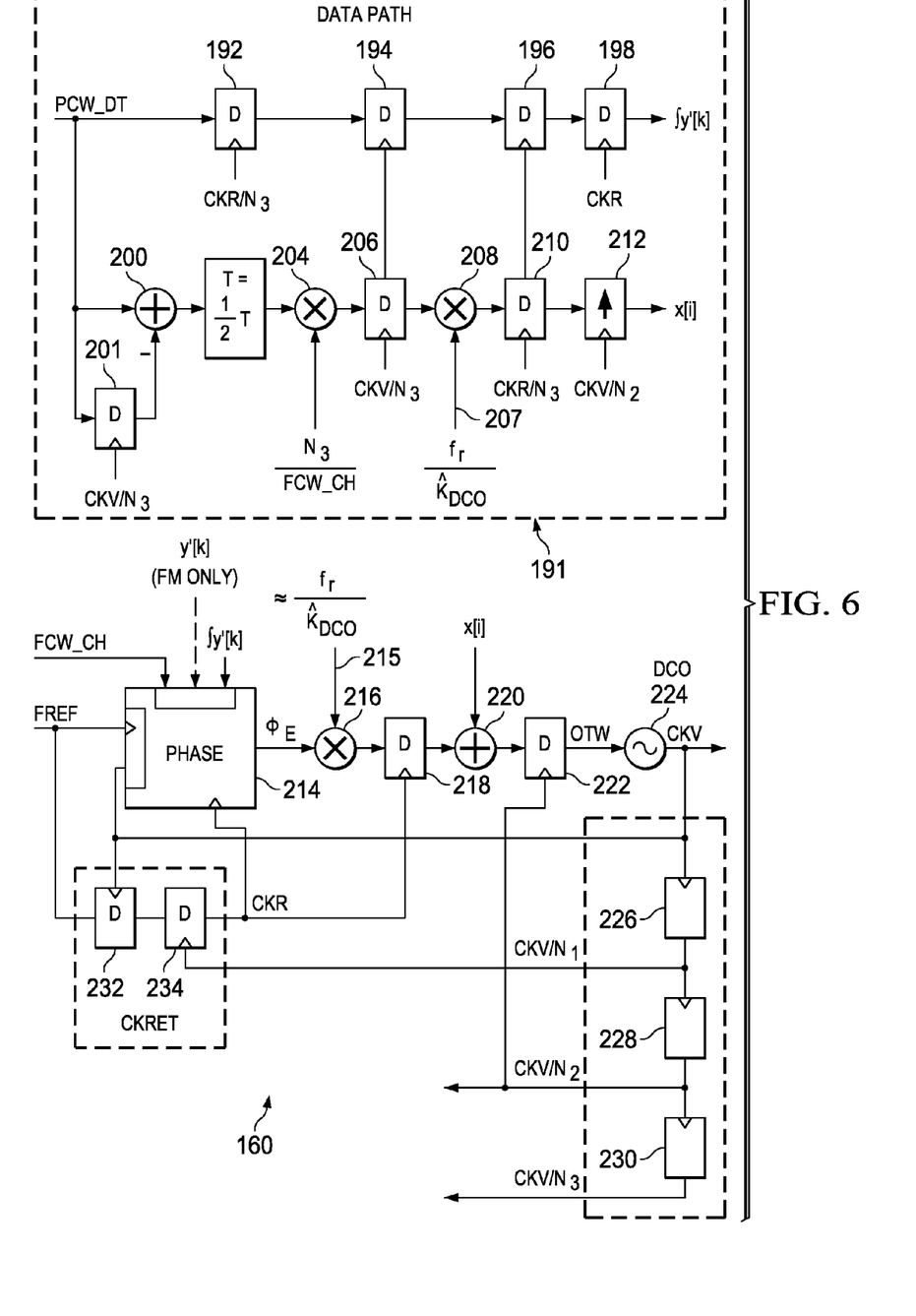
FIG. 6 is a block diagram illustrating the phase modulation path of a third embodiment transmitter incorporating the gain normalization mechanism of the present invention.

A block diagram illustrating the phase modulation path of a third embodiment transmitter is shown in FIG. 6. The baseband multi-data rate data path 191 comprises adder 200, delay registers 201, 192, 194, 196, 198, 206, 210, re-sampler or data rate converter 212 and multiplier 204 and gain normalization 208 for full bit multiplying the data by a high precision modulation path multiplier 207. The ADPLL loop 190 comprises phase accumulator/detector system 214, loop gain normalization 216 for multiplying a low precision loop multiplier 215, adder 220, registers 218, 222, clock edge dividers 226, 228, 230, frequency reference resampling registers 232, 234 and DCO 224.

The Figure illustrates the phase/frequency modulation path in the third generation DRP (i.e. third embodiment). It adds support for the high data rates of the WCDMA and WLAN standards by dramatically increasing the frequency modulating bandwidth. The maximum bandwidth limitation of $f_R/2$ in DRP1 and DRP2 architectures is broken here by employing CKV-down-divided clocks in the final stages of the modulating path. Since the modulating sample rate is much higher now than the CKR clock, the modulating stream is merged with the ADPLL phase/frequency corrections just before the DCO input.

The key features of the architecture are described below. First, the ADPLL phase operation is performed on the CKR clock. Second, in order to reduce circuit complexity and save dissipated power, the pulse-shaping filter at the front-end of the modulating path operates at the lower $CKV/N_3$ rate, where $N_3$ is an integer. The FCW-normalized samples are then resampled to the CKR rate for the y'[k] compensating path. The FCW-normalized samples are also converted to the tuning word format and then upconverted to the $CKV/N_2$ rate for the feedforward x[i] path.

Third, the tuning word samples and the DCO-normalized modulating data samples x[i] of the feed-forward branch are merged on the high-speed $CKV/N_2$ interface. Fourth, the PM modulating path is synchronous to the CKV clock, by entirely operating on the CKV integer divisions. Fifth, this architecture makes sense mainly for frequencies of $CKV/N_2>CKR$. To the extent of the DCO support of high frequency deviations, the modulating path can be made arbitrarily wide, from DC to $f_V/N_2$. Sixth, being synchronous to the CKV clock, the pulse-shaping filter clock rate is now channel dependent. This necessitates the adjustment of the coefficient or operating in an interpolative manner.

Seventh, as in DRP2 (second embodiment), The DCO gain multiplier, is split between the modulation path and the PLL loop, wherein $f_R/K_{DCO}$ appears independently in two places. Only the modulating path multiplier $f_R/K_{DCO}$ which controls the modulation index, needs to be set precisely. The ADPLL loop multiplier needs only to be accurate to the extent of the desired accuracy of the PLL bandwidth. Since the WCDMA operation (DRP3) is continuous as opposed to a bursty operation in GSM (DRP2), changing of the DCO normalization gain multiplier will not affect the baseline ADPLL operation.

In alternative embodiments, the methods of the present invention may be applicable to implementations of the invention in integrated circuits, field programmable gate arrays (FPGAs), chip sets or application specific integrated circuits (ASICs), DSP circuits, wired or wireless implementations and other communication system products.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of oscillator gain normalization in a phase locked loop (PLL) based transmitter, said method comprising the steps of:
   first applying a first gain multiplier to a modulation path;
   second applying a second gain multiplier to said PLL; and
   wherein said second gain multiplier comprises a significantly less precise version of said first gain multiplier.

2. The method according to claim 1, wherein said first gain multiplier comprises a modulation path multiplier adapted to control a modulation index of said modulation path.

3. The method according to claim 1, wherein said second gain multiplier comprises a PLL loop multiplier of sufficient accuracy to meet desired PLL bandwidth accuracy.

4. The method according to claim 1, wherein said first gain multiplier is adapted to be updated during a packet without substantially effecting operation of said PLL loop.

5. The method according to claim 1, wherein said second gain multiplier is adapted to be fixed for the duration of a packet.

6. The method according to claim 1, wherein dynamically updating the value of said first gain multiplier does not substantially create PLL loop perturbations.

7. The method according to claim 1, wherein said oscillator comprises a digitally controlled oscillator (DCO) and said PLL comprises an all digital PLL (ADPLL).

8. An apparatus for performing oscillator gain normalization in a phase locked loop (PLL) based transmitter, comprising:
   a modulation path comprising a modulating path multiplier adapted to be configured precisely; and
   a PLL comprising a loop multiplier adapted to be configured significantly less precise than that of said modulating path multiplier.

9. The apparatus according to claim 8, wherein said loop multiplier has sufficient precision to achieve desired accuracy of PLL loop bandwidth.

10. The apparatus according to claim 8, wherein said modulation path multiplier is adapted to control a modulation index of said modulation path.

11. The apparatus according to claim 8, wherein said modulation path multiplier is adapted to be updated during transmission without substantially effecting operation of said PLL loop.

12. The apparatus according to claim 8, wherein said loop multiplier is adapted to be fixed for the duration of a transmission.

13. The apparatus according to claim 8, wherein said modulation path is operative to dynamically change the value of said modulation path multiplier without creating perturbations to said PLL loop.

14. The apparatus according to claim 8, wherein said oscillator comprises a digitally controlled oscillator (DCO) and said PLL comprises an all digital PLL (ADPLL).

15. The apparatus according to claim 8, wherein splitting gain normalization between said modulation path and said PLL loop results in a flat modulating path bandwidth from DC to $f_R/2$.

16. A transmitter, comprising:
   a phase locked loop (PLL) based frequency synthesizer for performing frequency modulation, said PLL comprising a digitally controlled oscillator (DCO);
   means for performing oscillator gain normalization in said PLL, said means comprising:
      a modulation path comprising a modulating path multiplier adapted to be configured precisely;
      a PLL loop comprising a loop multiplier adapted to be configured significantly less precise than that of said modulating path multiplier; and
   a power amplifier comprising operative to generate an RF output signal proportional to the output of said PLL loop and said modulation path.

* * * * *